(12) United States Patent
Kawabata et al.

(10) Patent No.: US 9,966,343 B2
(45) Date of Patent: May 8, 2018

(54) ELECTRONIC CIRCUIT PACKAGE

(71) Applicant: TDK Corporation, Tokyo (JP)

(72) Inventors: Kenichi Kawabata, Tokyo (JP); Toshio Hayakawa, Tokyo (JP); Toshiro Okubo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days. days.

(21) Appl. No.: 15/464,775

(22) Filed: Mar. 21, 2017

(65) Prior Publication Data
US 2017/0309576 A1 Oct. 26, 2017

(30) Foreign Application Priority Data
Mar. 23, 2016 (JP) .................................. 2016-058730

(51) Int. Cl.
| | |
|---|---|
| *H01L 23/552* | (2006.01) |
| *H01L 23/498* | (2006.01) |
| *H01L 23/31* | (2006.01) |
| *H01L 23/00* | (2006.01) |
| *H01L 21/56* | (2006.01) |
| *H01L 21/78* | (2006.01) |
| *H01L 21/3205* | (2006.01) |

(52) U.S. Cl.
CPC ...... *H01L 23/552* (2013.01); *H01L 21/32051* (2013.01); *H01L 21/565* (2013.01); *H01L 21/78* (2013.01); *H01L 23/3121* (2013.01); *H01L 23/49838* (2013.01); *H01L 24/16* (2013.01); *H01L 24/97* (2013.01); *H01L 23/49822* (2013.01); *H01L 23/49827* (2013.01); *H01L 2224/16227* (2013.01); *H01L 2924/0103* (2013.01); *H01L 2924/01012* (2013.01); *H01L 2924/01013* (2013.01); *H01L 2924/01014* (2013.01); *H01L 2924/01022* (2013.01); *H01L 2924/01024* (2013.01); *H01L 2924/01025* (2013.01); *H01L 2924/01026* (2013.01); *H01L 2924/01027* (2013.01); *H01L 2924/01028* (2013.01); *H01L 2924/01029* (2013.01);
(Continued)

(58) Field of Classification Search
CPC . H01L 21/565; H01L 21/78; H01L 21/32051; H01L 23/552; H01L 23/49838; H01L 23/3121; H01L 24/16; H01L 24/97
USPC .......................................................... 257/659
See application file for complete search history.

(56) References Cited

U.S. PATENT DOCUMENTS

| | | | |
|---|---|---|---|
| 8,664,751 B2 * | 3/2014 | Kim ...................... | H01L 23/552 |
| | | | 257/659 |
| 9,362,196 B2 * | 6/2016 | Yamada .............. | H01L 23/3128 |

(Continued)

FOREIGN PATENT DOCUMENTS

| | | | |
|---|---|---|---|
| JP | 2004103998 A | 4/2004 | |
| JP | 2004332047 A | 11/2004 | |

(Continued)

*Primary Examiner* — Luan C Thai
(74) *Attorney, Agent, or Firm* — Young Law Firm, P.C.

(57) ABSTRACT

Disclosed herein is an electronic circuit package includes: a substrate having a power supply pattern; an electronic component mounted on a surface of the substrate; a mold resin covering the surface of the substrate so as to embed therein the electronic component; a magnetic film formed of a composite magnetic material obtained by dispersing magnetic fillers in a thermosetting resin material, the magnetic film covering upper and side surfaces of the molding resin and an edge portion of the front surface exposed to a side surface of the substrate; and a metal film connected to the power supply pattern and covering the molding resin through the magnetic film.

11 Claims, 13 Drawing Sheets

(52) U.S. Cl.
CPC ............... *H01L 2924/0132* (2013.01); *H01L 2924/0133* (2013.01); *H01L 2924/01046* (2013.01); *H01L 2924/01047* (2013.01); *H01L 2924/01049* (2013.01); *H01L 2924/01079* (2013.01); *H01L 2924/05442* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); *H01L 2924/3512* (2013.01)

(56) References Cited

U.S. PATENT DOCUMENTS

| | | |
|---|---|---|
| 9,490,221 B2 * | 11/2016 | Arai .................. H01L 23/552 |
| 2004/0221683 A1 | 11/2004 | Shimoda et al. |
| 2005/0051358 A1 | 3/2005 | Kawamoto et al. |
| 2011/0298111 A1 | 12/2011 | Kim |
| 2011/0304015 A1 | 12/2011 | Kim et al. |
| 2015/0035127 A1 | 2/2015 | Yang et al. |

FOREIGN PATENT DOCUMENTS

| | | |
|---|---|---|
| JP | 2006019341 A | 1/2006 |
| JP | 2009-218484 A | 9/2009 |
| JP | 2010-087058 A | 4/2010 |
| JP | 2011077430 A | 4/2011 |
| JP | 2011249628 A | 12/2011 |
| JP | 2011258920 A | 12/2011 |
| JP | 2015201479 A | 11/2015 |

* cited by examiner

ELECTRONIC CIRCUIT PACKAGE

BACKGROUND OF THE INVENTION

Field of the Invention

The present invention relates to an electronic circuit package and, more particularly, to an electronic circuit package provided with a composite shielding function having both an electromagnetic shielding function and a magnetic shielding function.

Description of Related Art

In recent years, an electronic device such as a smartphone is equipped with a high-performance radio communication circuit and a high-performance digital chip, and an operating frequency of a semiconductor IC used therein tends to increase. Further, adoption of an SIP (System-In Package) having a 2.5D or 3D structure, in which a plurality of semiconductor ICs are connected by a shortest wiring, is accelerated, and modularization of a power supply system is expected to accelerate. Further, an electronic circuit module having a large number of modulated electronic components (collective term of components, such as passive components (an inductor, a capacitor, a resistor, a filter, etc.), active components (a transistor, a diode, etc.), integrated circuit components (an semiconductor IC, etc.) and other components required for electronic circuit configuration) is expected to become more and more popular, and an electronic circuit package which is a collective term for the above SIP, electronic circuit module, and the like tends to be mounted in high density along with sophistication, miniaturization, and thinning of an electronic device such as a smartphone. However, this tendency poses a problem of malfunction and radio disturbance due to noise. The problem of malfunction and radio disturbance is difficult to be solved by conventional noise countermeasure techniques. Thus, recently, self-shielding of the electronic circuit package has become accelerated, and an electromagnetic shielding using a conductive paste or a plating or sputtering method has been proposed and put into practical use, and higher shielding characteristics are required in the future.

In order to realize the higher shielding characteristics, a composite shielding structure, which has both an electromagnetic shielding function and a magnetic shielding function, is proposed in recent years. In order to realize the composite shielding structure, it is necessary to form, in an electronic circuit package, an electromagnetic shielding by a conductive film (metal film) and a magnetic shielding by a magnetic film.

For example, an electronic circuit module described in JP 2010-087058A has a configuration in which a metal film and a magnetic layer are laminated in this order on a surface of a molding resin. Further, an electronic circuit module described in JP 2011-077430A prevents failures such as cracks occurring when a circuit board is cut by reducing an exposure ratio of a copper foil (inner layer pattern) exposed to the side surface of a substrate.

However, according to the present inventors' study, it is found that the configuration of JP 2010-087058A in which a metal film and a magnetic layer are laminated in this order on a surface of a molding resin cannot obtain sufficient shielding effect as an electronic circuit package for mobile communication device that is increasingly required to achieve a high shielding property in the future. Further, in the configuration of JP 2011-077430A, cracks at cutting can be prevented, but interface peeling or cracks may occur during reflow. That is, during reflow, moisture contained in a substrate or molding resin is vaporized and expanded to generate stress, and a solder used for joining electronic components is re-melted and volume-expanded to generate stress. Such stress causes generation of peeling and cracks at various interfaces at a substrate side surface part.

SUMMARY

The object of the present invention is therefore to provide an electronic circuit package capable of achieving both high composite shielding effect and high reliability during reflow.

An electronic circuit package according to the present invention includes: a substrate having a power supply pattern; an electronic component mounted on a front surface of the substrate; a molding resin that covers the front surface of the substrate so as to embed the electronic component therein; a magnetic film formed of a composite magnetic material obtained by dispersing magnetic fillers in a thermosetting resin material, the magnetic film covering upper and side surfaces of the molding resin and an edge of the front surface exposed to a side surface of the substrate; and a metal film connected to the power supply pattern and covering the molding resin with an intervention of the magnetic film.

According to the present invention, the magnetic film and the metal film are formed in this order on the upper surface of the molding resin, so that high composite shielding characteristics can be obtained. In addition, the magnetic film formed of a composite magnetic material covers the edge of the substrate front surface, so that moisture expanded during reflow becomes movable through the thermosetting resin material, and stress is alleviated. Therefore it becomes possible to prevent interface peeling and cracks at the edge.

In the present invention, it is preferable that the substrate side surface includes an exposed portion at which the power supply pattern is exposed and the metal film is connected to the power supply pattern by covering the exposed portion without an intervention of the magnetic film. With this configuration, the power supply pattern exposed to the substrate side surface is not covered with the magnetic film, thereby making it possible to easily connect the metal film to the power supply pattern.

In the present invention, it is preferable that the substrate further has a solder resist formed on the front surface and the magnetic film covers the interface between the solder resist and the front surface of the substrate which is exposed to the side surface of the substrate. With this configuration, peeling and cracks at the interface between the solder resist and the substrate, and peeling of the metal film can be prevented.

In this case, it is preferable that the substrate further has a first wiring pattern formed on the front surface and the magnetic film covers the interface between the first wiring pattern and the front surface of the substrate which is exposed to the side surface of the substrate. With this configuration, peeling and cracks at the interface between the first wiring pattern and the substrate, and peeling of the metal film can be prevented.

Further, in this case, the magnetic film preferably further covers the interface between the solder resist and the first wiring pattern which is exposed to the side surface of the substrate. With this configuration, peeling and cracks at the interface between the solder resist and the first wiring pattern, and peeling of the metal film can be prevented.

In the present invention, it is preferable that the substrate further has a second wiring pattern embedded therein and the magnetic film further covers the interface between the second wiring pattern and the substrate which is exposed to the side surface of the substrate. With this configuration, peeling and cracks at the interface between the second wiring pattern and the substrate, and peeling of the metal film can be prevented.

In the present invention, the magnetic filler is preferably formed of ferrite or soft magnetic metal and, more preferably, the surface of the magnetic filler is insulation-coated.

In the present invention, it is preferable that the metal film is mainly composed of at least one metal selected from a group consisting of Au, Ag, Cu, and Al and that a surface of the metal film is covered with an antioxidant film.

As described above, according to the present invention, it becomes possible to achieve both high composite shielding effect and high reliability during reflow.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

First Embodiment

Figure 1:
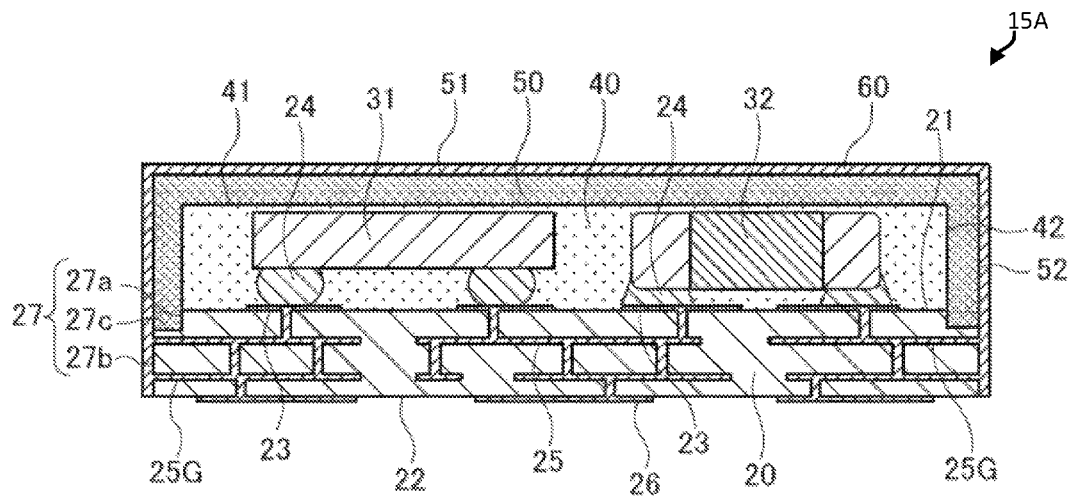
FIG. 1 is a cross-sectional view illustrating a configuration of an electronic circuit package according to a first embodiment of the present invention.

FIG. 1 is a cross-sectional view illustrating a configuration of an electronic circuit package 15A according to the first embodiment of the present invention.

As illustrated in FIG. 1, the electronic circuit package 15A according to the present embodiment includes a substrate 20, a plurality of electronic components 31 and 32 mounted on the substrate 20, a mold resin 40 covering a front surface 21 of the substrate 20 so as to embed the electronic components 31 and 32, a magnetic film 50 covering the mold resin 40, and a metal film 60 covering the magnetic film 50 and the mold resin 40.

Although the type of the electronic circuit package 15A according to the present embodiment is not especially limited, examples thereof include a high-frequency module handling a high-frequency signal, a power supply module performing power supply control, an SIP (System-In-Package) having a 2.5D structure or a 3D structure, and a semiconductor package for radio communication or digital circuit. Although only two electronic components 31 and 32 are illustrated in FIG. 1, more electronic components are incorporated actually.

The substrate 20 has a double-sided and multilayer wiring structure in which a large number of wirings are embedded therein and may be any type of substrate including: a thermosetting resin based organic substrate such as an FR-4, an FR-5, a BT, a cyanate ester, a phenol, or an imide; a thermoplastic resin based organic substrate such as a liquid crystal polymer; an LTCC substrate; an HTCC substrate; and a flexible substrate. In the present embodiment, the substrate 20 has a four-layer structure including wiring layers formed on the front surface 21 and a back surface 22 and two wiring layers embedded therein. On the front surface 21 of the substrate 20, a plural of land patterns 23 are formed. Land patterns 23 are an internal electrode for connecting to the electronic components 31 and 32. The land patterns 23 and each of the electronic components 31 and 32 are electrically and mechanically connected to each other through a respective solder 24 (or a conductive paste). For example, the electronic component 31 is a semiconductor chip such as a controller, and electronic component 32 is a passive component such as a capacitor or a coil. Some electronic components (e.g., thinned semiconductor chip) may be embedded in the substrate 20.

The land patterns 23 are connected to external terminals 26 formed on the back surface 22 of the substrate 20 through internal wirings 25 formed inside the substrate 20. Upon actual use, the electronic circuit package 15A is mounted on an unillustrated mother board, and land patterns on the mother board and the external terminals 26 of the electronic circuit package 15A are electrically connected. A material for a conductor forming the land patterns 23, internal wirings 25, and external terminals 26 may be a metal such as copper, silver, gold, nickel, chrome, aluminum, palladium, indium, or a metal alloy thereof or may be a conductive material using resin or glass as a binder; however, when the substrate 20 is an organic substrate or a flexible substrate, copper or silver is preferably used in terms of cost and/or conductivity. Methods such as printing, plating, foil lamination, sputtering, vapor deposition, and inkjet can be used to form the above conductive materials.

The internal wirings 25 to which G is added at the end of its sign in FIG. 1 are power supply patterns. The power supply patterns 25G are typically ground patterns to which a ground potential is to be applied; however, it is not limited to the ground patterns as long as the power supply patterns 25G are a pattern to which a fixed potential is to be applied.

The mold resin 40 covers the surface 21 of the substrate 20 so as to embed therein the electronic components 31 and 32. As a material for the mold resin 40, a material based on a thermosetting material or a thermoplastic material and blended with fillers for adjusting a thermal expansion coefficient can be used.

A top surface 41 and a side surface 42 of the mold resin 40 are covered with the magnetic film 50. Although not particularly limited, it is preferable that the mold resin 40 and magnetic film 50 directly contact each other without intervention of an adhesive or the like. The magnetic film 50 is a film composed of a composite magnetic material in which magnetic fillers are dispersed in a thermosetting resin material and serves as a magnetic shield.

As a thermosetting resin material used for the magnetic film 50, an epoxy resin, a phenol resin, a silicone resin, a diallyl phthalate resin, a polyimide resin, an urethane resin, and the like may be used, and the magnetic film 50 can be formed by using a thick-film formation method such as a printing method, a molding method, a slit nozzle coating method, a spray method, a dispensing method, an injection method, a transfer method, a compression molding method, or a lamination method using an uncured sheet-like resin. Using the thermosetting resin material, reliability required for electronic circuit packages such as heat resistance, insulation performance, impact resistance, falling resistance, and the like can be enhanced.

As the magnetic filler, a ferrite or a soft magnetic metal is preferably used, and a soft magnetic metal having a high bulk permeability is more preferably used. As the ferrite or soft magnetic metal, one or two or more metals selected from a group consisting of Fe, Ni, Zn, Mn, Co, Cr, Mg, Al, and Si and oxides thereof may be exemplified. As specific examples, a ferrite such as Ni—Zn ferrite, Mn—Zn ferrite, Ni—Cu—Zn ferrite, a permalloy (Fe—Ni alloy), a super permalloy (Fe—Ni—Mo alloy), a sendust (Fe—Si—Al alloy), an Fe—Si alloy, an Fe—Co alloy, an Fe—Cr alloy, an Fe—Cr—Si alloy, an Fe—Ni—Co alloy, and Fe, and the like may be exemplified. The shape of the magnetic filler is not especially limited; however, it may be formed into a spherical shape for a high filling level, and fillers having a plurality of particle size distribution may be blended or combined for a densest filling structure. In order to maximize a shield effect by a permeability real component and a thermal conversion effect of a loss by a permeability imaginary component, it is more preferable to form by making flat powder having an aspect ratio of 5 or more orientate.

It is preferable that the surface of the magnetic filler is insulation-coated by an oxide of a metal such as Si, Al, Ti, or Mg, or an organic material for enhancing fluidity, adhesion, and insulation performance. For the insulation coating, an oxide film may be formed by coating a thermosetting material on the surface of the magnetic filler or dehydration reaction of a metal alkoxide, formation of a silicon oxide coating film is most preferable. It is more preferable to apply an organofunctional coupling treatment on the formed coating film.

The composite magnetic material can be formed on the top surface 41 and side surface 42 of the mold resin using a known method such as a printing method, a molding method, a slit nozzle coating method, a spray method, a dispensing method, or a lamination method using an uncured sheet-like resin.

The top surface 51 and side surface 52 of the magnetic film 50, and a part of the side surface 27 of the substrate 20 are covered with the metal film 60. The metal film 60 serves as an electromagnetic shielding and is preferably mainly composed of at least one metal selected from a group consisting of Au, Ag, Cu, and Al. The metal film 60 preferably has a resistance as low as possible and it is most preferable to use Cu in terms of cost and the like. An outer surface of the metal film 60 is preferably covered with an anticorrosive metal such as SUS, Ni, Cr, Ti, or brass or an antioxidant coating made of a resin such as an epoxy, a phenol, an imide, an urethane, or a silicone. The reason for this is that the metal film 60 undergoes oxidative deterioration by an external environment such as heat or humidity; and, therefore, the aforementioned treatment is preferable to suppress and prevent the oxidative deterioration. A formation method for the metal film 60 may be appropriately selected from known methods, such as a sputtering method, a vapor-deposition method, an electroless plating method, an electrolytic plating method. Before formation of the metal film 60, pretreatment for enhancing adhesion, such as plasma treatment, coupling treatment, blast treatment, or etching treatment, may be performed. As a base of the metal film 60, a high adhesion metal film such as a titanium film, a chromium film, or an SUS film may be formed thinly in advance.

In the present embodiment, the side surface 27 of the substrate 20 is formed stepwise. Specifically, a side surface lower portion 27b protrudes from a side surface upper portion 27a. The side surface upper portion 27a and a step portion 27c are covered with the magnetic film 50, and the side surface lower portion 27b is covered with the metal film 60 without being covered with the magnetic film 50. Thus, in the present embodiment, the edge portion of the front surface 21 exposed to the side surface 27 of the substrate 20 is covered with the magnetic film 50. In this embodiment, the side surface 52 of the magnetic film 50 and the side surface lower portion 27b of the substrate 20 form the same plane.

As illustrated in FIG. 1, the power supply patterns 25G are exposed to the side surface lower portion 27b of the substrate 20. The metal film 60 is connected to the power supply pattern 25G by covering the side surface lower portion 27b of the substrate 20.

Although not especially limited, it is desirable that a resistance value at an interface between the metal film 60 and the magnetic film 50 is equal to or larger than $10^6 \Omega$. According to this configuration, it becomes possible to prevent deterioration in the magnetic characteristics of the magnetic film 50 due to inflow of an eddy current because the eddy current generated by electromagnetic wave noise entering the metal film 60 hardly flows in the magnetic film 50. The resistance value at the interface between the metal film 60 and the magnetic film 50 refers to a surface resistance of the magnetic film 50 when the metal film 60 and magnetic film 50 directly contact each other and to a surface resistance of an insulating film when the insulating film is present between the metal film 60 and the magnetic film 50.

Figure 2:
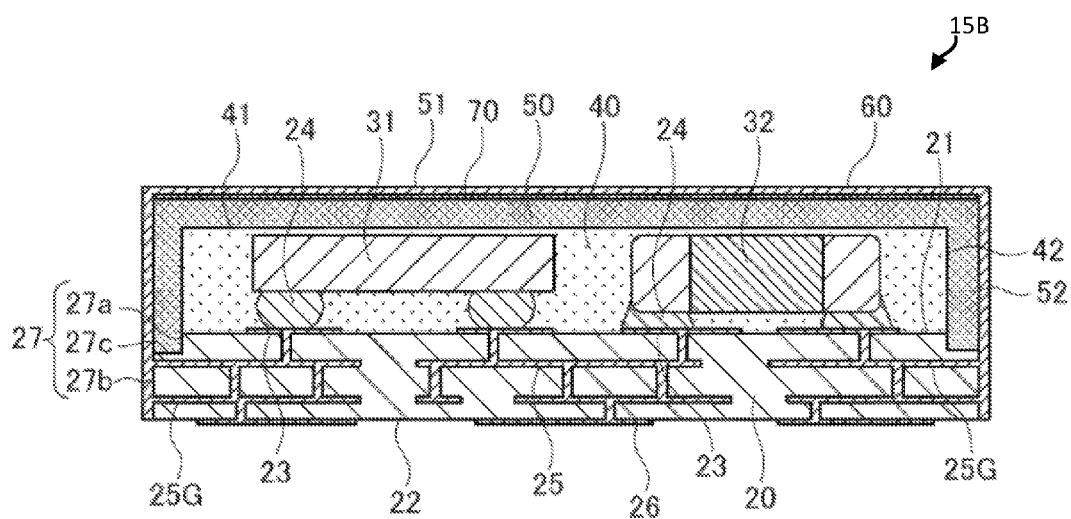
FIG. 2 is a cross-sectional view illustrating a configuration of an electronic circuit package according to a modification of the first embodiment.

As methods in order to make a resistance value at an interface between the metal film 60 and the magnetic film 50 equal to or higher than $10^6\Omega$, a method using a material having a sufficiently high surface resistance as the material for the magnetic film 50 or a method forming a thin insulating material on the top surface 51 of the magnetic film 50 are exemplified. FIG. 2 is a cross-sectional view illustrating a configuration of an electronic circuit package 15B according to a modification. The electronic circuit package 15B differs from the electronic circuit package 15A shown in FIG. 1 in that a thin insulating film 70 is interposed between the top surface 51 of the magnetic film 50 and the metal film 60. By interposing the insulating film 70, it becomes possible to make a resistance value at an interface between the metal film 60 and the magnetic film 50 equal to or higher than $10^6\Omega$ even when a material having a comparatively low resistance value is used as the material for the magnetic film 50, thereby making it possible to prevent deterioration in magnetic characteristics due to an eddy current. Although not shown in the drawings, the thin insulating film 70 may be interposed between the side surface 52 of the magnetic film 50 and the metal film 60.

As described above, in the electronic circuit package 15A (and 15B) according to the present embodiment, the magnetic film 50 and metal film 60 are laminated in this order on the top surface 41 and side surface 42 of the mold resin 40. With this configuration, as compared with a case where the magnetic film 50 and metal film 60 are laminated in the reverse order, electromagnetic noise radiated from the electronic components 31 and 32 can be shielded more effectively. This is because the electromagnetic wave noise radiated from the electronic components 31 and 32 is partially absorbed when it passes through the magnetic film 50, and the remaining electromagnetic wave noise that has not been absorbed is partially reflected by the metal film 60 and passes through the magnetic film 50 once again. In this manner, the magnetic film 50 acts on the incident electromagnetic wave noise twice, thereby effectively shielding the electromagnetic wave noise radiated from the electronic components 31 and 32.

Further, in the present embodiment, since the side surface lower portion 27b of the substrate 20 is covered with the metal film 60 without being covered with the magnetic film 50, the power supply pattern 25G exposed to this portion can be connected to the metal film 60. Thus, even though the magnetic film 50 and the metal film 60 are laminated in this order, the metal film 60 can be easily connected to the power supply pattern 25G.

Further, in the present embodiment, the edge portion of the front surface 21 exposed to the side surface 27 of the substrate 20 is covered with the magnetic film 50 formed of the composite magnetic material, so that product reliability can be enhanced. That is, during reflow, moisture contained in the substrate 20 or molding resin 40 is vaporized and expanded to generate stress, and a solder used for joining electronic components is re-melted and volume-expanded to generate stress. Such stress concentrates on various interfaces exposed to the side surface 27 of the substrate 20, which may cause peeling at the interfaces.

FIGS. 3 to 6 are schematic enlarged views of the electronic circuit package 15A of the present embodiment and illustrate different cross sections respectively.

Figure 3:
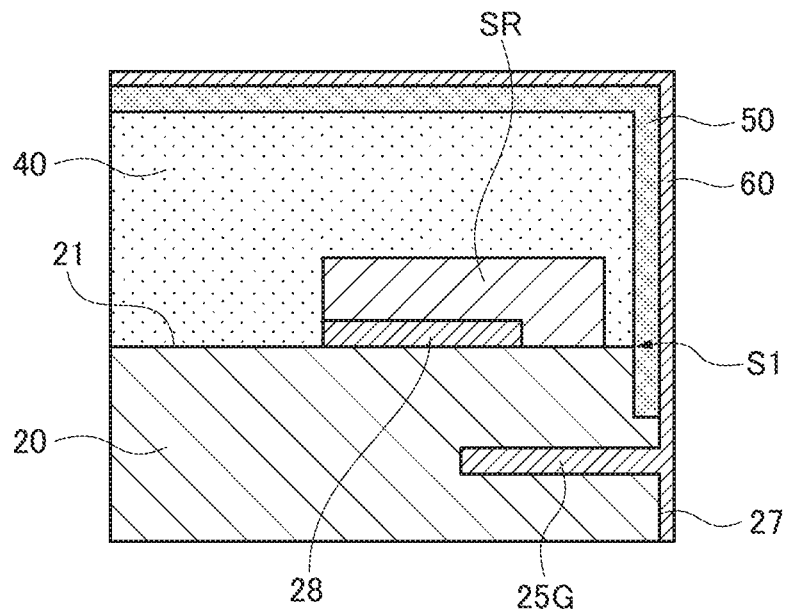
FIG. 3 is a schematic enlarged view of the electronic circuit package shown in FIG. 1 and illustrates a cross-section where a specified interface appears.

In the cross section illustrated in FIG. 3, the edge portion of the front surface 21 exposed to the side surface 27 of the substrate 20 is directly covered with the molding resin 40. In such a cross section, moisture vaporized and expanded during reflow concentrates on an interface S1 between the front surface 21 of the substrate 20 and the molding resin 40, causing stress peeling the edge portion of the interface S1 to act. However, in the present embodiment, the edge portion of the interface S1 is covered with the magnetic film 50 formed of the composite magnetic material, so that moisture reaching the edge portion of the interface S1 becomes movable through the magnetic film 50, thus preventing peeling at the interface S1.

Figure 4:
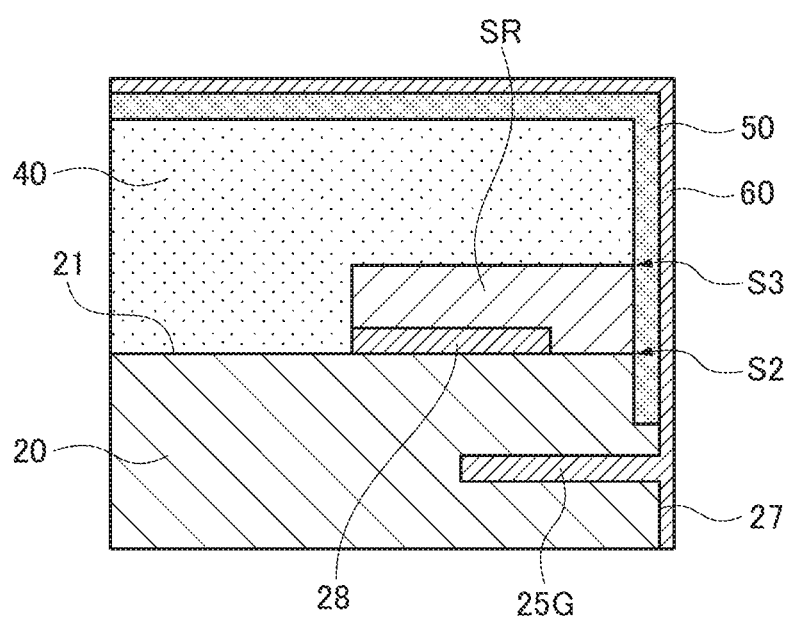
FIG. 4 is a schematic enlarged view of the electronic circuit package shown in FIG. 1 and illustrates a cross-section where an another interface appears.

In the cross section illustrated in FIG. 4, the side surface of a solder resist SR is exposed from the molding resin 40, and thus the edge portion of the front surface 21 exposed to the side surface 27 of the substrate 20 contacts the solder resist SR. The solder resist SR is an insulating layer formed on the front surface 21 of the substrate 20 and covers a wiring pattern 28 formed on the front surface 21 of the substrate 20. If the solder resist SR like this exists, peeling and/or peeing of the metal film 60 are likely to occur at an interface S2 between the solder resist SR and the front surface 21 of the substrate 20 and/or an interface S3 between the solder resist SR and the molding resin 40. However, in the present embodiment, the edge portions of the interfaces S2 and S3 are each covered with the magnetic film 50 formed of the composite magnetic material, so that moisture reaching the edge portions of the interfaces S2 and S3 becomes movable through the magnetic film 50, thus preventing peeling at the interfaces S2 and S3 and peeling of the metal film 60.

Figure 5:
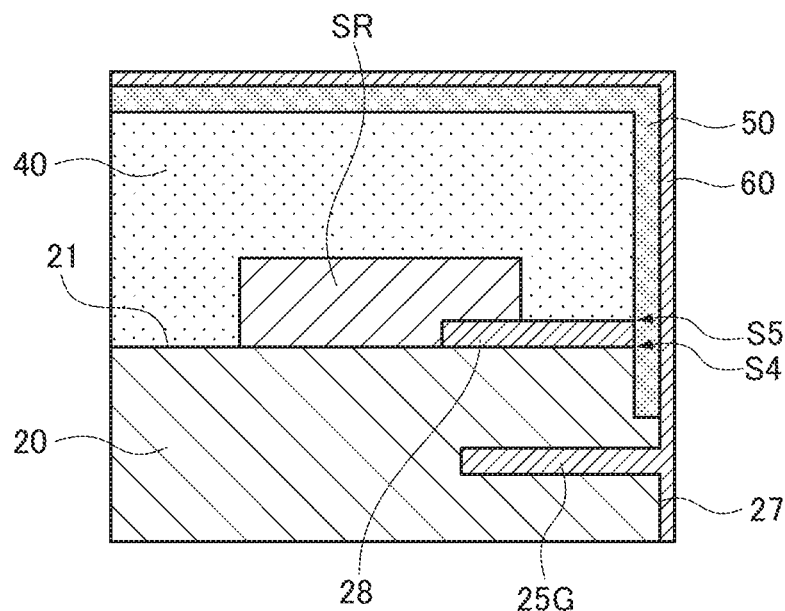
FIG. 5 is a schematic enlarged view of the electronic circuit package shown in FIG. 1 and illustrates a cross-section where a still another interface appears.

In the cross section illustrated in FIG. 5, the side surface of the wiring pattern 28 is exposed from the molding resin 40, and thus the edge portion of the front surface 21 exposed to the side surface 27 of the substrate 20 contacts the wiring pattern 28. If the wiring pattern 28 like this exists, peeling and/or peeing of the metal film 60 are likely to occur at an interface S4 between the wiring pattern 28 and the front surface 21 of the substrate 20 and an interface S5 between the wiring pattern 28 and the molding resin 40. However, in the present embodiment, the edge portions of the interfaces S4 and S5 are each covered with the magnetic film 50 formed of the composite magnetic material, so that moisture reaching the edge portions of the interfaces S4 and S5 becomes movable through the magnetic film 50, thus preventing peeling at the interfaces S4 and S5 and peeling of the metal film 60.

Figure 6:
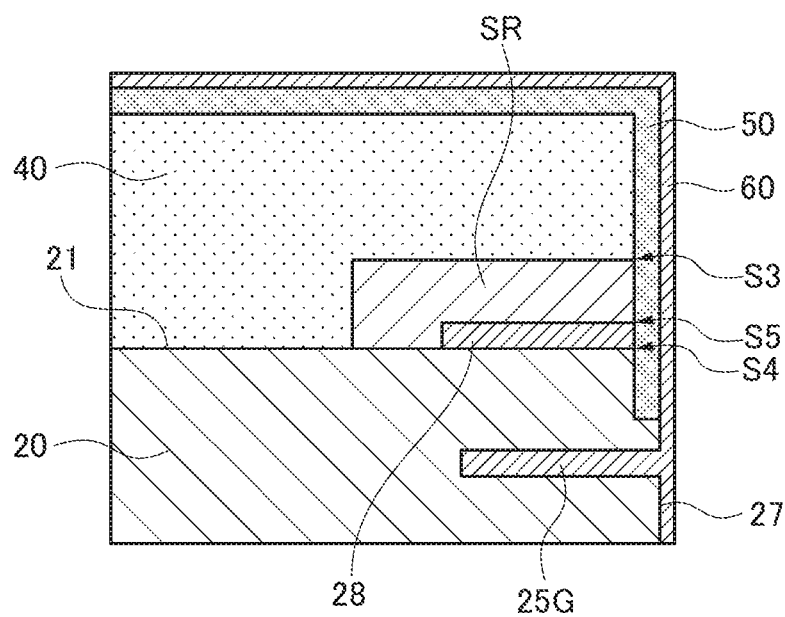
FIG. 6 is a schematic enlarged view of the electronic circuit package shown in FIG. 1 and illustrates a cross-section where a still another interface appears.

In the cross section illustrated in FIG. 6, both the side surface of the solder resist SR and the side surface of the wiring pattern 28 are exposed from the molding resin 40. If the solder resist SR and wiring pattern 28 like this exists, peeling and/or peeing of the metal film 60 are likely to occur at the interfaces S3 to S5. However, in the present embodiment, the edge portions of the interfaces S3 to S5 are each covered with the magnetic film 50 formed of the composite magnetic material, so that moisture reaching the edge portions of the interfaces S3 to S5 becomes movable through the magnetic film 50, thus preventing peeling at the interfaces S3 to S5 and peeling of the metal film 60.

As described above, in the present embodiment, the edge portions of the front surface 21 exposed to the side surface 27 of the substrate 20 is covered with the magnetic film 50 formed of the composite magnetic material, so that peeling at the interfaces S1 to S5 and peeling of the metal film 60 which may occur during reflow are prevented, whereby reliability is enhanced.

Further, in case that the magnetic film 50 is directly formed on the upper surface 41 and side surface 42 of the molding resin 40, an adhesive or the like is not interposed between the molding resin 40 and the magnetic film 50, which is advantageous in reduction in product height.

The following describes a manufacturing method for the electronic circuit package 15A according to the present embodiment.

FIGS. 7 to 11 are process views for explaining a manufacturing method for the electronic circuit package 15A.

Figure 7:
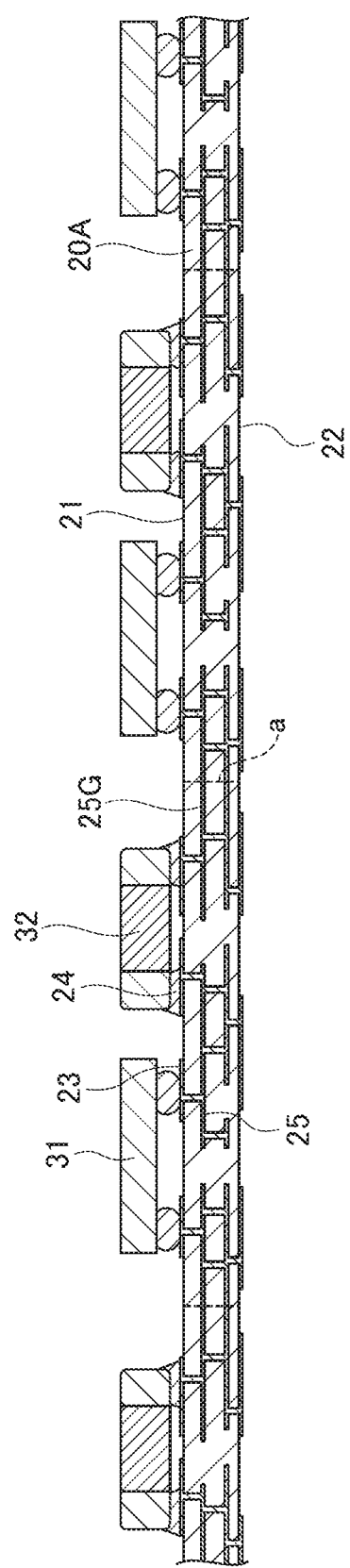
FIG. 7 is a process view for explaining a manufacturing method for the electronic circuit package shown in FIG. 1.

As illustrated in FIG. 7, an assembly substrate 20A having a multilayer wiring structure is prepared. A plurality of land patterns 23 are formed on the front surface 21 of the assembly substrate 20A, and a plurality of external terminals 26 are formed on the back surface 22 of the assembly substrate 20A. Further, a plurality of the internal wirings 25 including the power supply patterns 25G are formed in an inner layer of the assembly substrate 20A. A dashed line a in FIG. 7 denotes a part to be cut in a subsequent dicing process. As illustrated in FIG. 7, the power supply patterns 25G are provided at a position overlapping the dashed line a in a plan view.

Then, as illustrated in FIG. 7, the plurality of electronic components 31 and 32 are mounted on the front surface 21 of the assembly substrate 20A so as to be connected to the land patterns 23. Specifically, the solder 24 is provided on the land pattern 23, followed by mounting of the electronic components 31 and 32 and by reflowing, whereby the electronic components 31 and 32 are connected to the land patterns 23.

Figure 8:
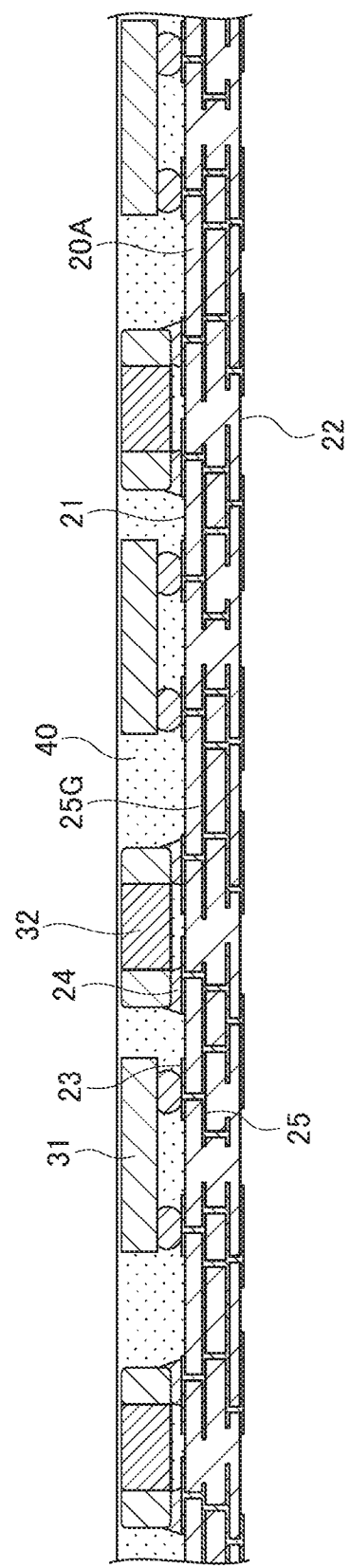
FIG. 8 is a process view for explaining a manufacturing method for the electronic circuit package shown in FIG. 1.

Then, as illustrated in FIG. 8, the front surface 21 of the assembly substrate 20A is covered with the mold resin 40 so as to embed the electronic components 31 and 32 in the mold resin 40. As the formation method for the mold resin 40, compression, injection, print, dispense, nozzle coating process, and the like can be used.

Figure 9:
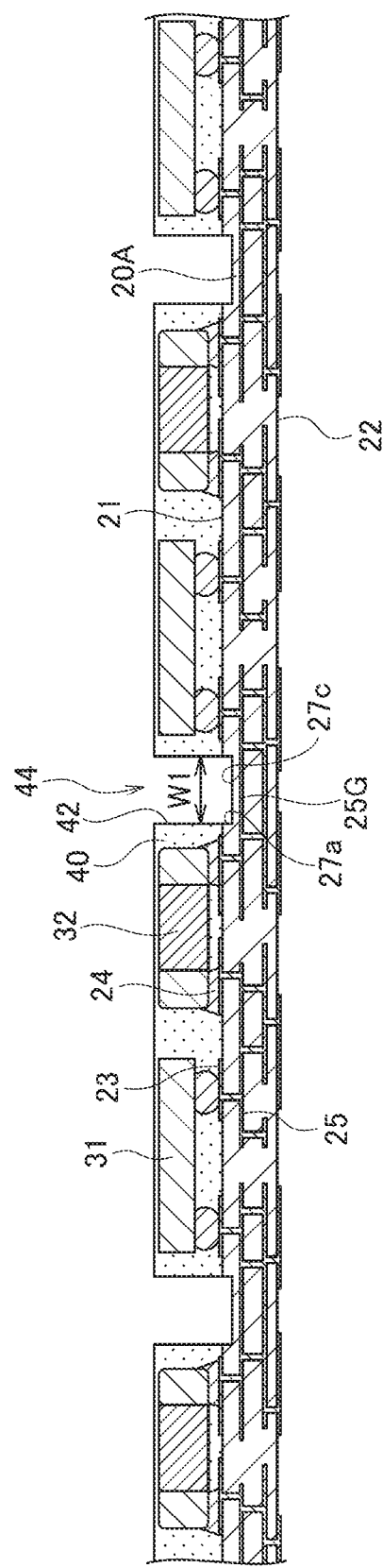
FIG. 9 is a process view for explaining a manufacturing method for the electronic circuit package shown in FIG. 1.

Subsequently, as illustrated in FIG. 9, a groove 44 having a width W1 is formed along the dashed line a denoting a dicing position. The groove 44 is formed so as to almost completely cut the molding resin 40 and so as not to reach the internal wiring 25 formed inside the substrate 20. As a result, the side surface 42 of the molding resin 40 and the side surface upper portion 27a and step portion 27c of the substrate 20 are exposed inside the groove 44.

Figure 10:
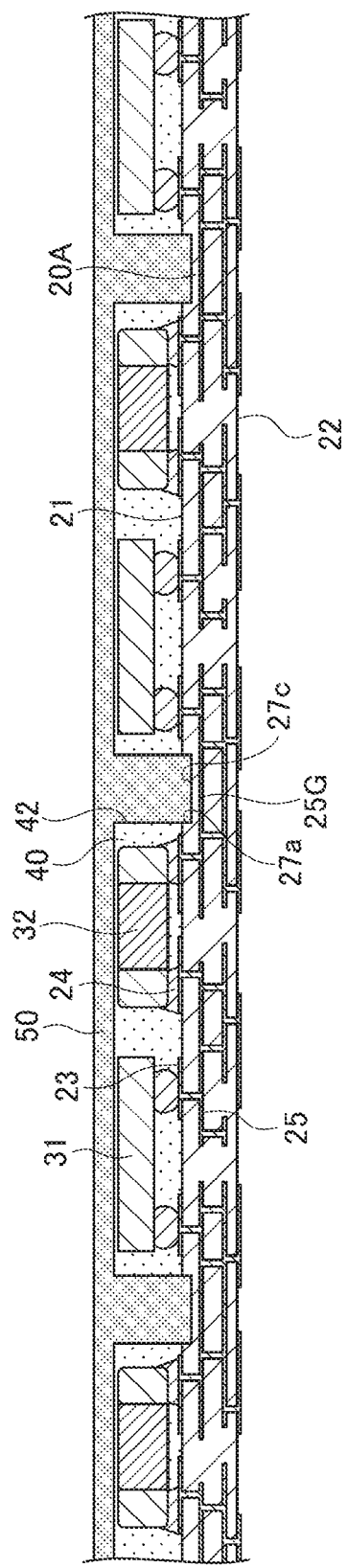
FIG. 10 is a process view for explaining a manufacturing method for the electronic circuit package shown in FIG. 1.

Subsequently, as illustrated in FIG. 10, the magnetic film 50 is formed so as to fill the groove 44. In this case, in order to enhance adhesion between the molding resin 40 and the magnetic film 50, the upper surface 41 of the molding resin 40 may be subjected to blasting or etching to form a physical irregularity thereon, may be subjected to surface modification by means of plasma or short wavelength UV, or may be subjected to organofunctional coupling treatment.

Although it is not essential to completely fill the groove 44 with the magnetic film 50, the magnetic film 50 needs to have a certain film thickness to fill the groove 44 with the magnetic film 50. As the formation method for the magnetic film 50, a thick-film formation method such as a printing method, a molding method, a slit nozzle coating method, a spray method, a dispensing method, an injection method, a transfer method, a compression molding method, or a lamination method using an uncured sheet-like resin can be used. When the magnetic film 50 is formed by using the printing method, slit nozzle coating method, spraying method, dispensing method, and the like, the viscosity of the composite magnetic material is preferably controlled as needed. The viscosity control may be made by diluting the composite magnetic material with one or two or more solvents having a boiling point of 50° C. to 300° C. The thermosetting material mainly consists of a main agent, a curing agent, and a curing accelerator; however, two or more kinds of main agent or curing agent may be blended according to required characteristics. Further, solvents may be mixed and a coupling agent for enhancing adhesion and fluidity, a fire retardant for flame retardancy, a dye and a pigment for coloration, a non-reactive resin material for imparting flexibility, and a non-magnetic filler for adjusting a thermal expansion coefficient may be blended or combined. The materials may be kneaded or dispersed by a known means such as a kneader, a mixer, a vacuum defoaming stirring machine, or a three-roll mill.

If the insulating film 70 is interposed between the magnetic film 50 and the metal film 60 as in the modification illustrated in FIG. 2, after formation of the magnetic film 50, an insulating material such as a thermosetting material, a heat-resistant thermoplastic material, an Si oxide, a low-melting point glass may be thinly formed on the top surface 51 of the magnetic film 50.

Figure 11:
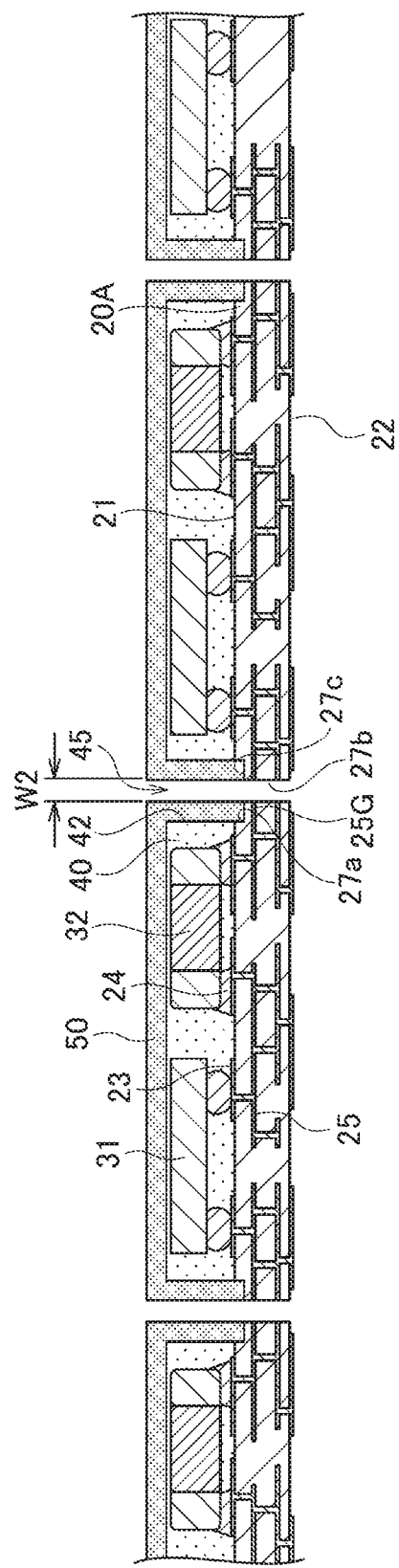
FIG. 11 is a process view for explaining a manufacturing method for the electronic circuit package shown in FIG. 1.

Then, as illustrated in FIG. 11, the assembly substrate 20A is cut by forming a groove 45 having a width W2 along the dashed line a to divide the assembly substrate 20A into individual substrates 20. At this time, the width W2 of the groove 45 needs to be thinner than the width W1 of the groove 44. As a result, the substrates 20 are individuated while the magnetic film 50 formed inside the groove 44 is left. In the present embodiment, because the power supply patterns 25G pass the dashed line a as a dicing position, the power supply patterns 25G are exposed from the side surface lower portion 27b of the substrate 20 when the assembly substrate 20A is cut along the dashed line a.

Then, the metal film 60 is formed so as to cover the top surface 51 and side surface 52 of the magnetic film 50, and the side surface lower portion 27b of the substrate 20, whereby the electronic circuit package 15A according to the present embodiment is completed. As a formation method for the metal film 60, a sputtering method, a vapor-deposition method, an electroless plating method, and an electrolytic plating method can be used. Before formation of the metal film 60, pretreatment for enhancing adhesion, such as plasma treatment, coupling treatment, blast treatment, or etching treatment, may be performed. As a base of the metal film 60, a high adhesion metal film such as a titanium or a chromium may be formed thinly in advance.

As described above, in the manufacturing method for the electronic circuit package 15A according to the present embodiment, the two grooves 44 and 45 having different widths are sequentially formed, so that it is possible to cover the side surface 42 of the molding resin 40 with the magnetic film 50 and to easily connect the metal film 60 to the power supply pattern 25G without requiring complicated processes. Further, direct formation of the magnetic film 50 on the upper surface 41 and side surface 42 of the molding resin 40 eliminates the need of using an adhesive or the like, which is advantageous in height reduction.

Figure 12:
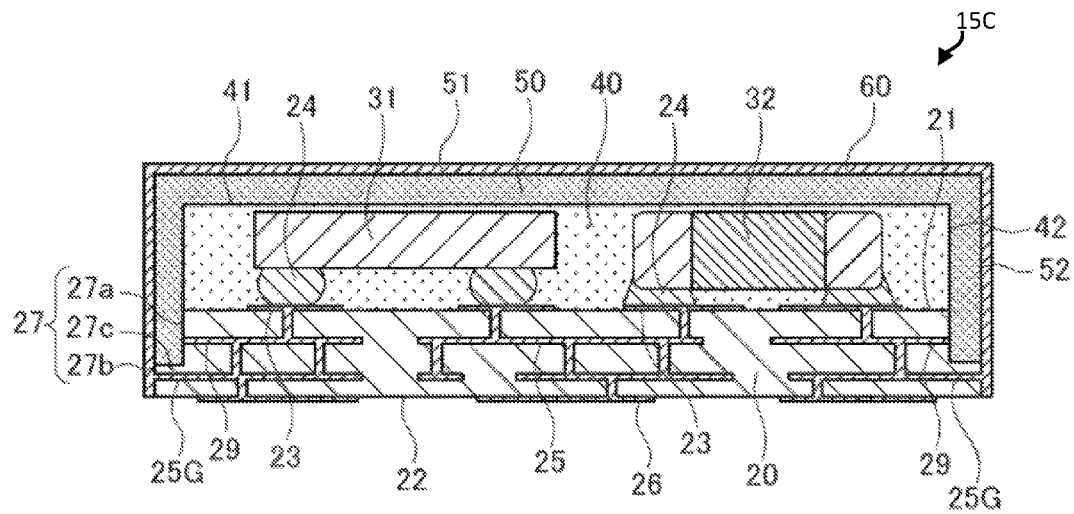
FIG. 12 is a cross-sectional view illustrating a configuration of an electronic circuit package according to a modification of the first embodiment.

FIG. 12 is a cross-sectional view illustrating the configuration of an electronic circuit package 15C according to a modification.

The electronic circuit package 15C illustrated in FIG. 12 differs from the electronic circuit package 15A illustrated in FIG. 1 in that the magnetic film 50 covers a wiring pattern 29 exposed to the side surface 27 of the substrate 20. Other configurations are the same as those of the electronic circuit package 15A, so the same reference numerals are given to the same elements, and overlapping description will be omitted.

The wiring pattern 29 contacting the magnetic film 50 may be a power supply pattern such as a ground or a signal wiring. However, in case that a material having high conductivity is used as the material of the magnetic film 50, the wiring pattern 29 contacting the magnetic film 50 needs to be the wiring pattern 29 which is applied with the same potential as that of the power supply pattern 25G that the metal film 60 contacts. The wiring pattern 29 is exposed to the side surface upper portion 27a of the substrate 20, and accordingly the interface between the base material of the substrate 20 and the wiring pattern 29 appears at the side surface upper portion 27a of the substrate 20.

With this configuration, it is possible to prevent not only the peeling between the substrate and the solder resist or between the mold material and the solder resist, crack in the solder resist, mold material, or the substrate, and swelling, peeling, or the like in the metal film 60 formed as an electromagnetic shield film, but also a peeling in the interface between the substrate 20 and the wiring pattern 29 due to expansion of the moisture, thus ensuring higher reliability. Also in this case, by using the composite magnetic material as the material for the magnetic film 50, peeling of the wiring pattern 29 can be prevented more effectively.

The electronic circuit package 15C according to the present embodiment can be manufactured by forming the groove 44 deeper in the process of FIG. 9.

Figure 13:
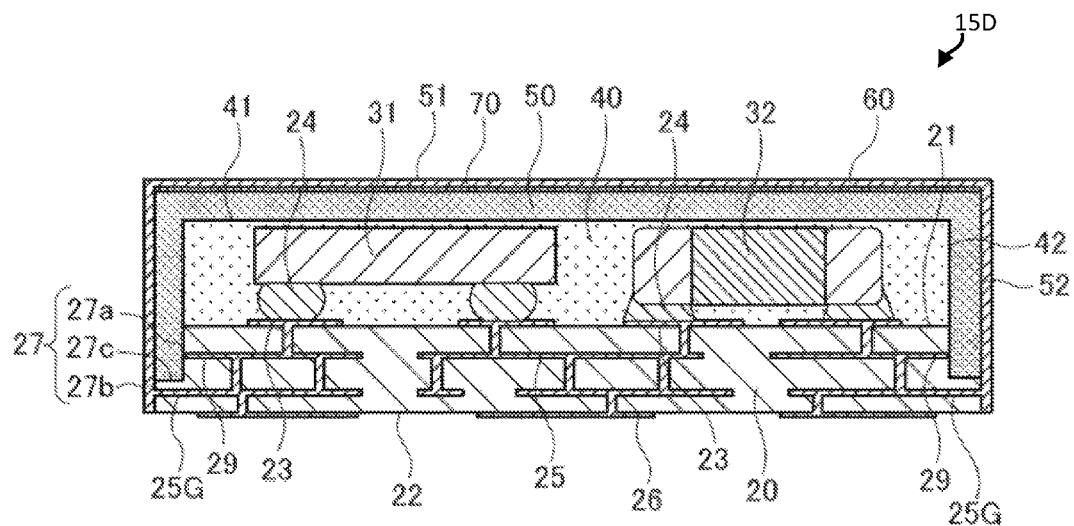
FIG. 13 is a cross-sectional view illustrating a configuration of an electronic circuit package according to an another modification of the first embodiment.

In this case as well, in case that a material having a comparatively low resistance value is used as the material of the magnetic film 50, it is preferable to interpose the thin insulating film 70 between the upper surface 51 (and side surface 52) of the magnetic film 50 and the metal film 60 as in an electronic circuit package 15D according to a modification shown in FIG. 13.

Second Embodiment

Figure 14:
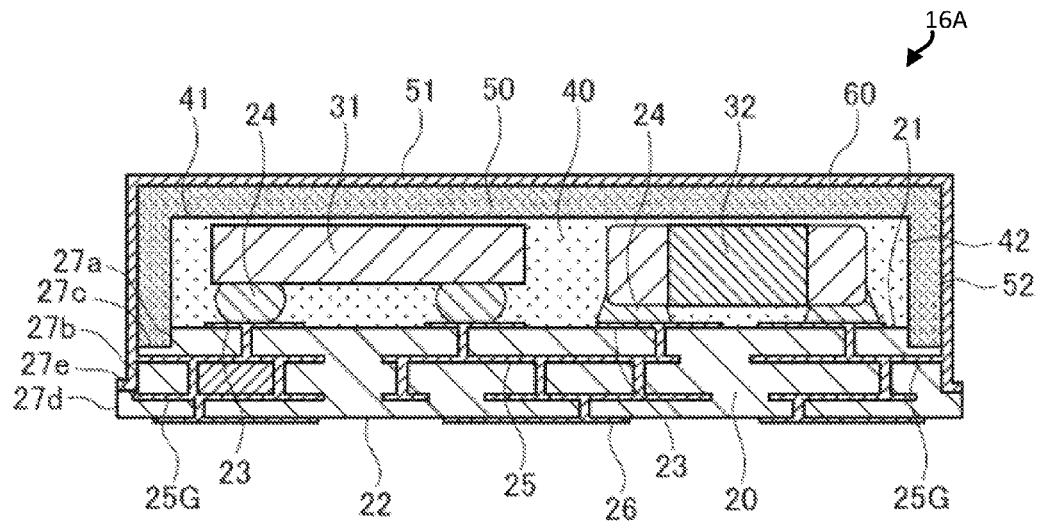
FIG. 14 is a cross-sectional view illustrating a configuration of an electronic circuit package according to a second embodiment of the present invention.

FIG. 14 is a cross-sectional view illustrating the configuration of an electronic circuit package 16A according to a second embodiment of the present invention.

As illustrated in FIG. 14, an electronic circuit package 16A according to the present embodiment is the same as the electronic circuit package 15A according to the first embodiment illustrated in FIG. 1 except for the shapes of the substrate 20 and metal film 60. Thus, the same reference numerals are given to the same elements, and overlapping description will be omitted.

Figure 15:
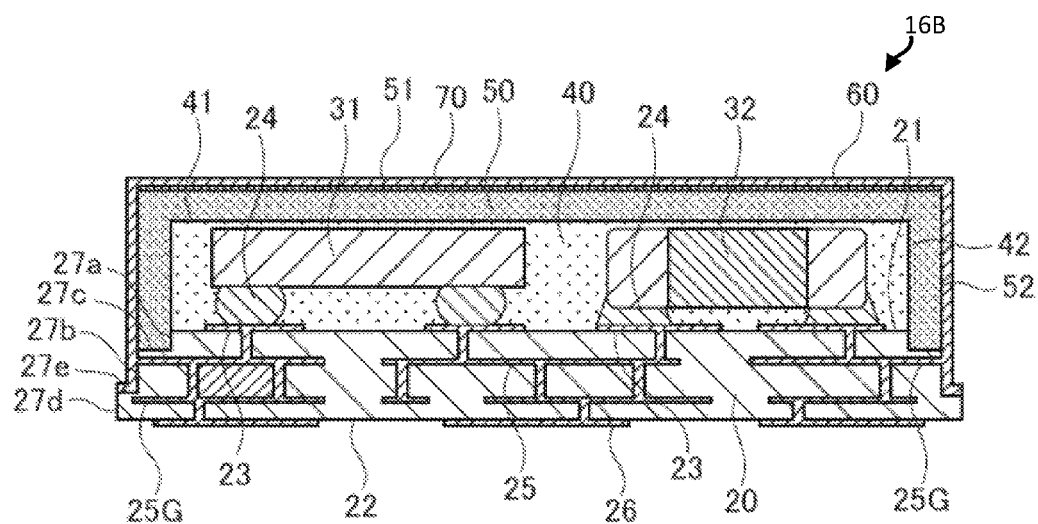
FIG. 15 is a cross-sectional view illustrating a configuration of an electronic circuit package according to a modification of the second embodiment.

In the present embodiment, the side surface 27 of the substrate 20 has a three-step form. Specifically, the side surface lower portion 27b protrudes from the side surface upper portion 27a, and a side surface lowermost portion 27d protrudes from the side surface lower portion 27b. The magnetic film 50 covers the side surface upper portion 27a and step portion 27c of the substrate 20, and the metal film 60 is provided so as to cover the side surface lower portion 27b and a step portion 27e. The side surface lowermost portion 27d is not covered with the metal film 60. In the present embodiment as well, the power supply pattern 25G is exposed to the side surface lower portion 27b of the substrate 20, so that the metal film 60 is connected to the power supply pattern 25G through the side surface lower portion 27b. In case that a material having a comparatively low resistance value is used as the material of the magnetic film 50, it is preferable to interpose the thin insulating film 70 between the upper surface 51 (and side surface 52) of the magnetic film 50 and the metal film 60 as in an electronic circuit package 16B according to a modification shown in FIG. 15.

Figure 16:
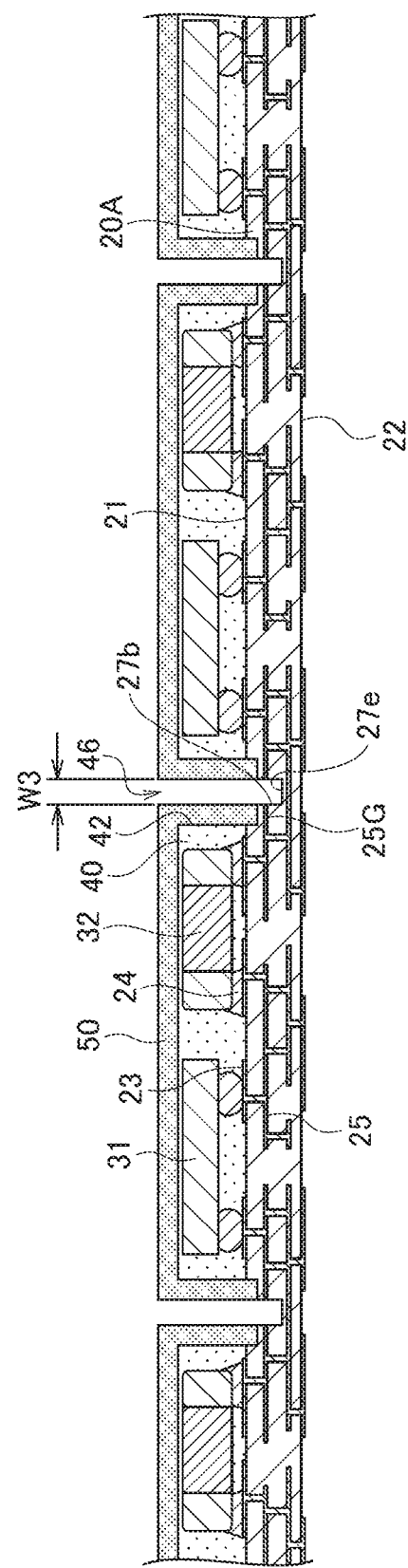
FIG. 16 is a process view for explaining a manufacturing method for the electronic circuit package shown in FIG. 14.
Figure 17:
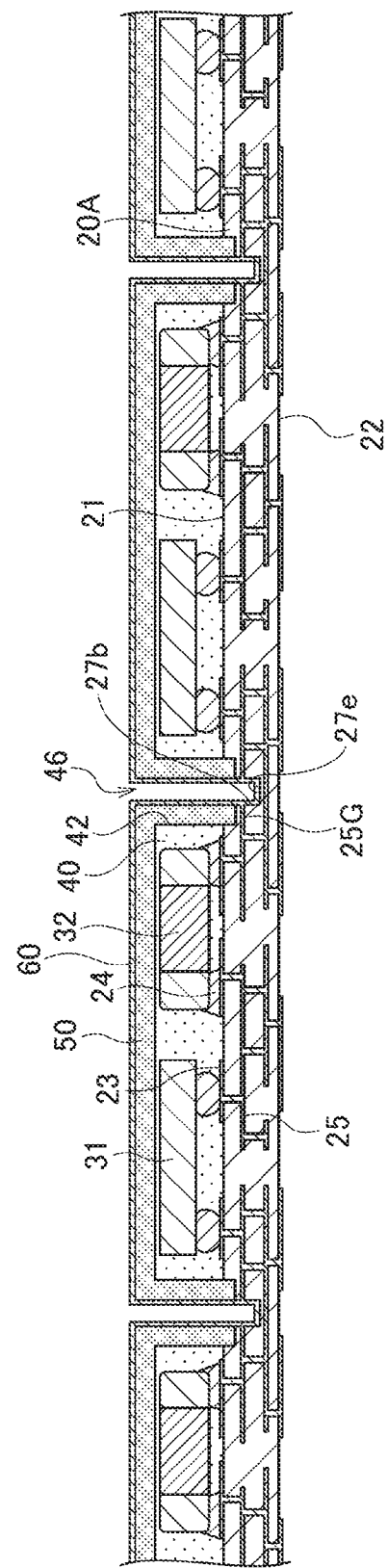
FIG. 17 is a process view for explaining a manufacturing method for the electronic circuit package shown in FIG. 14.

FIGS. 16 and 17 are process views for explaining a manufacturing method for the electronic circuit package 16A.

First, the magnetic film 50 is formed on the upper surface 41 of the molding resin 40 and on the inside of the groove 44 according to the method described using FIGS. 7 to 10. Then, as illustrated in FIG. 16, a groove 46 having a width W3 is formed along the dashed line a denoting the dicing position. The groove 46 is formed to have such a depth that the groove 46 completely cuts the molding resin 40 and does not completely cut the substrate 20. The width W3 is made smaller than the width W1 of the groove 44 illustrated in FIG. 9. As a result, the side surface 52 of the magnetic film 50 and the side surface lower portion 27b and step portion 27e of the substrate 20 are exposed inside the groove 46. The groove 46 needs to be formed to have such a depth that the power supply pattern 25G is exposed at least from the side surface lower portion 27b.

Subsequently, as illustrated in FIG. 17, the metal film 60 is formed by using a sputtering method, a vapor-deposition method, an electroless plating method, or an electrolytic plating method. As a result, regarding the metal film 60, the upper surface 51 of the magnetic film 50 and the inside of the groove 46 are covered with the metal film 60. At this time, the power supply pattern 25G exposed to the side surface lower portion 27b of the substrate 20 is connected to the metal film 60.

Then, the assembly substrate 20A is cut along the dashed line a to individuate the substrate 20, whereby the electronic circuit package 16A according to the present embodiment is completed.

As described above, according to the manufacturing method for the electronic circuit package 16A of the present embodiment, the power supply pattern 25G is exposed through the groove 46 which does not completely separate the substrate 20, so that the metal film 60 can be formed before the substrate 20 is individuated, thus facilitating formation of the metal film 60.

Figure 18:
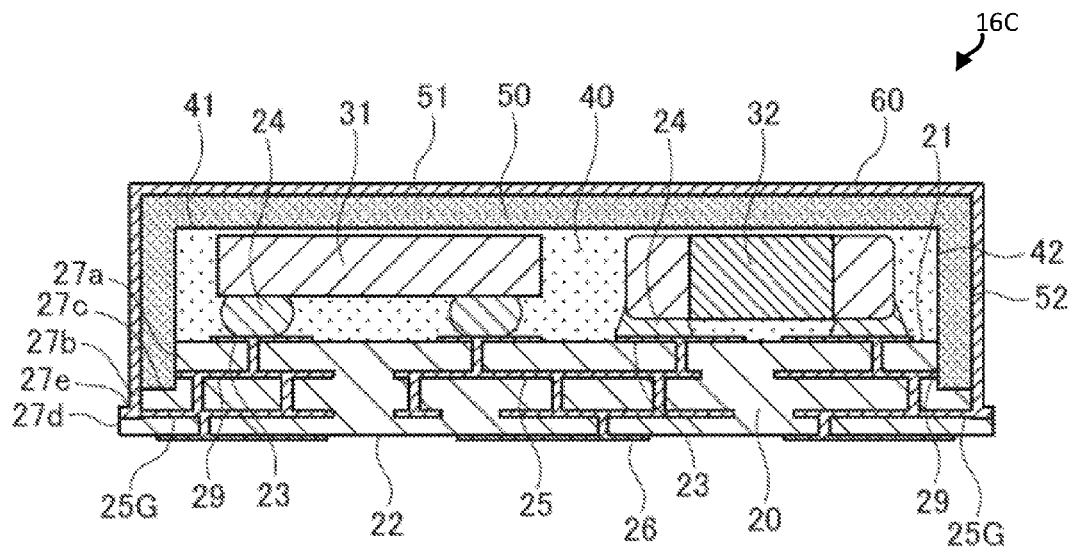
FIG. 18 is a cross-sectional view illustrating a configuration of an electronic circuit package according to a modification of the second embodiment.

FIG. 18 is a cross-sectional view illustrating the configuration of an electronic circuit package 16C according to a modification.

The electronic circuit package 16C illustrated in FIG. 18 differs from the electronic circuit package 16A illustrated in FIG. 14 in that the magnetic film 50 covers the wiring pattern 29 exposed to the side surface upper portion 27a of the substrate 20. Other configurations are the same as those of the electronic circuit package 16A, so the same reference numerals are given to the same elements, and overlapping description will be omitted.

As in the electronic circuit package 15C illustrated in FIG. 12, the wiring pattern 29 contacting the magnetic film 50 may be a power supply pattern such as a ground or a signal wiring. However, in case that a material having high conductivity is used as the material of the magnetic film 50, the wiring pattern 29 contacting the magnetic film 50 needs to be the wiring pattern 29 which is applied with the same potential as that of the power supply pattern 25G that the metal film 60 contacts. The wiring pattern 29 is exposed to the side surface upper portion 27a of the substrate 20, and accordingly the interface between the base material of the substrate 20 and wiring pattern 29 appears at the side surface upper portion 27a of the substrate 20.

With the above configuration, peeling of the solder resist and cracks therein can be prevented and, in addition, peeling at the interface between the substrate 20 and the wiring pattern 29 and peeling of the metal film 60 due to expansion of the moisture can be prevented, making it possible to ensure higher reliability.

Figure 19:
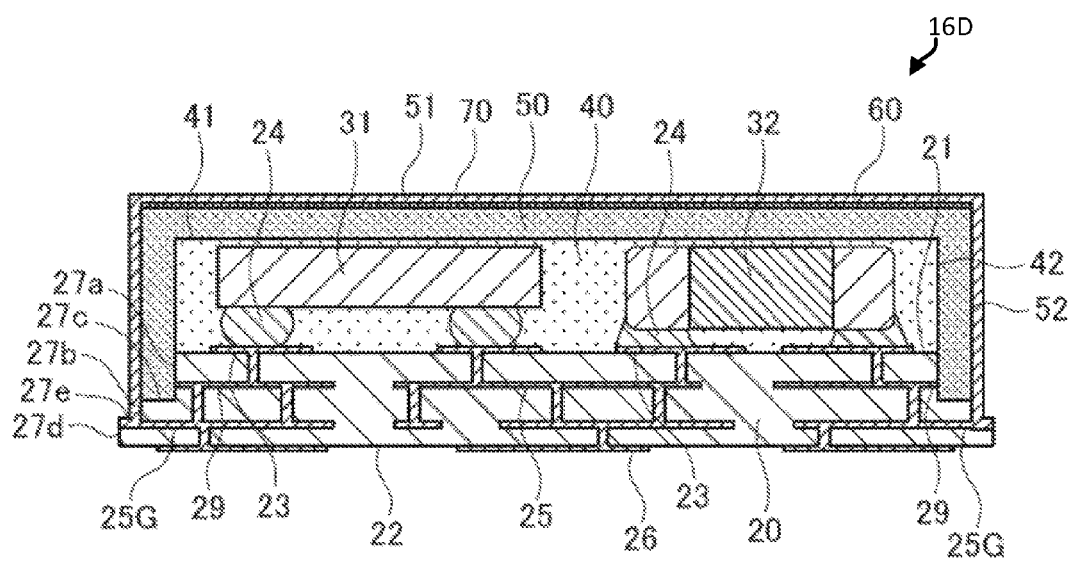
FIG. 19 is a cross-sectional view illustrating a configuration of an electronic circuit package according to another modification of the second embodiment.

In this case as well, in case that a material having a comparatively low resistance value is used as the material of the magnetic film 50, it is preferable to interpose the thin insulating film 70 between the upper surface 51 (and side surface 52) of the magnetic film 50 and the metal film 60 as in an electronic circuit package 16D according to a modification shown in FIG. 19.

While the preferred embodiments of the present invention have been described, the present invention is not limited thereto. It is needless to say that various modifications may be made without departing from the gist of the invention and all of the modifications thereof are included in the scope of the present invention.

EXAMPLES

A sample having the same structure as that of the electronic circuit package 15C of FIG. 12 was actually produced. As the assembly substrate 20A, a multilayer resin substrate having a plane size of 50 mm×50 mm and a thickness of 0.3 mm.

As a Fe-based spherical magnetic filler, AKT 4.5Si-5.0Cr (D50=30 μm) manufactured by Mitsubishi Steel Mfg. Co., Ltd. and carbonyl iron powder (D50=6 μm) manufactured by BASF Corporation were used, and a $SiO_2$ coating was applied by the hydrolysis of metal alkoxide. Then, AKT 4.5Si-5.0Cr and carbonyl iron powder were weighed in a weight ratio of 8:2 and added to a thermosetting resin at 90 wt %. The thermosetting resin and a solvent used were as follows: HP-7200H (dicyclopentadiene type epoxy resin) manufactured by DIC. Co., Ltd. as a main agent; TD2093 (phenol novolac type epoxy resin) manufactured by DIC. Co., Ltd. as a curing agent; wt % of C11Z-CN (imidazole) manufactured by Shikoku Chemicals Corporation relative to the main agent, as a curing accelerator; and butyl carbitol acetate as the solvent. Then, the above resin materials were blended together, followed by kneading and stirring by a vacuum defoaming stirring machine. After that, butylcarbitol acetate was appropriately added so that the viscosity at 10 rpm is 50 Pa·S, followed by kneading and stirring again by the vacuum defoaming stirring machine, whereby a composite magnetic material paste was obtained.

Then, after the groove 44 of FIG. 9 was formed, the above composite magnetic material paste was printed by screen printing, followed by drying and heat-cured at 180° C. for 60 minutes. As a result, the structure of FIG. 10 was obtained. Thereafter, with the groove 45, the assembly substrate 20A was individuated into a plane size of 8.5 mm×8.5 mm, and the metal film 60 was formed on the entire surface of the substrate 20 except for the back surface 22 thereof. For the metal film 60, a laminated film of Cu (film thickness of 1 μm) and Ni (film thickness of 2 μm) was formed by electroless plating.

As a comparative example, a sample was produced by removing the magnetic film 50 from the sample of the example. The sample of the comparative example was produced as follows: the processes of FIGS. 7 and 8 were performed; the assembly substrate 20A was cut along the dashed line a into individual substrates 20; and the metal film 60 was formed by electroless plating.

Then, water absorption reflow test was performed to each sample. The water absorption test was carried out by performing pretreatment under the conditions of JEDEC MSL3 (60° C., 60% RH, 60 hours), MSL2a (60° C., 60% RH, 120 hours), and MSL1 (85° C., 85% RH, 168 hours) and by making the sample pass through a reflow furnace of 260° C. three times. Then, after the appearance was checked using a microscope, the cross section of the substrate 20 was exposed by grinding, followed by observation of the cross section using a SEM for checking the number of failures such as peeling or cracks and a failure mode. The number of samples in each condition was 22. The results are shown in Table 1.

TABLE 1

| | Pre-treatment condition | Failure number | Failure rate | Failure mode (appearance observation using microscope) | Failure mode (observation using SEM) |
|---|---|---|---|---|---|
| Comparative Example | MSL3 | 0/22 | 0% | | |
| | MSL2a | 2/22 | 9% | Swelling of metal film | Peeling of metal film |
| | MSL1 | 7/22 | 32% | Swelling of metal film | Peeling of metal film |
| Example | MSL3 | 0/22 | 0% | | |
| | MSL2a | 0/22 | 0% | | |
| | MSL1 | 0/22 | 0% | | |

As shown in Table 1, in the comparative example, the sample subjected to pretreatment under the MSL2a has a 9% failure rate, and sample subjected to pretreatment under the MSL1 has a 32% failure rate. As for the failure mode, swelling of the metal film 60 is observed through a microscope, and peeling of the metal film 60 is observed under SEM. On the other hand, in the example, samples subjected to pretreatment under any conditions have no failure. Thus, it is found that internal stress is alleviated by covering a part of the side surface 27 of the substrate 20 with the magnetic film 50 to enhance adhesion of the land pattern 23 and/or internal wiring 25.

What is claimed is:

1. An electronic circuit package comprising:
a substrate having a power supply pattern;
an electronic component mounted on a front surface of the substrate;
a molding resin that covers the front surface of the substrate so as to embed the electronic component therein;
a magnetic film formed of a composite magnetic material obtained by dispersing magnetic fillers in a thermosetting resin material, the magnetic film covering upper and side surfaces of the molding resin and an edge portion of the front surface exposed to a side surface of the substrate; and
a metal film connected to the power supply pattern and covering the molding resin with an intervention of the magnetic film,
wherein the side surface of the substrate includes an exposed portion at which the power supply pattern is exposed, and
wherein the metal film is connected to the power supply pattern by covering the exposed portion without an intervention of the magnetic film.

2. The electronic circuit package as claimed in claim 1, wherein the substrate further has a solder resist formed on the front surface, and
wherein the magnetic film covers an interface between the solder resist and the front surface of the substrate which is exposed to the side surface of the substrate.

3. The electronic circuit package as claimed in claim 2, wherein the substrate further has a first wiring pattern formed on the front surface, and
wherein the magnetic film covers an interface between the first wiring pattern and the front surface of the substrate which is exposed to the substrate side surface.

4. The electronic circuit package as claimed in claim 3, wherein the magnetic film preferably further covers an interface between the solder resist and the first wiring pattern which is exposed to the side surface of the substrate.

5. The electronic circuit package as claimed in claim 1, wherein the substrate further has a second wiring pattern embedded therein, and
wherein the magnetic film further covers an interface between the second wiring pattern and the substrate which is exposed to the side surface of the substrate.

6. The electronic circuit package as claimed in claim 1, wherein the magnetic filler is formed of ferrite or soft magnetic metal.

7. The electronic circuit package as claimed in claim 6, wherein a surface of the magnetic filler is insulation-coated.

8. The electronic circuit package as claimed in claim 1, wherein the metal film is mainly composed of at least one metal selected from a group consisting of Au, Ag, Cu, and Al.

9. The electronic circuit package as claimed in claim 1, wherein a surface of the metal film is covered with an antioxidant film.

10. An electronic circuit package comprising:
a substrate having a power supply pattern, the substrate having a stepwise side surface including a side surface upper portion, a side surface lower portion protruding from the side surface upper portion, and a step portion connecting the side surface upper portion and the side surface lower portion;
an electronic component mounted on a front surface of the substrate;
a molding resin that covers the front surface of the substrate so as to embed the electronic component therein;
a magnetic film formed of a composite magnetic material obtained by dispersing magnetic fillers in a thermosetting resin material, the magnetic film covering an edge portion of the front surface exposed to the side surface of the substrate by covering upper and side surfaces of the molding resin and the side surface upper portion and step portion of the substrate; and
a metal film connected to the power supply pattern and covering the molding resin with an intervention of the magnetic film,
wherein the power supply pattern is exposed to the side surface lower portion of the substrate without being covered by the magnetic film, and
wherein the metal film contacts to the power supply pattern exposed to the side surface lower portion of the substrate.

11. The electronic circuit package as claimed in claim 10, wherein a resistance value at an interface between the magnetic film and the metal film is equal to or higher than $10^6 \Omega$.

* * * * *